(12) United States Patent
Wile et al.

(10) Patent No.: US 7,474,163 B1
(45) Date of Patent: Jan. 6, 2009

(54) SYSTEM AND METHOD FOR OSCILLATOR NOISE CANCELLATION

(75) Inventors: Don Wile, San Jose, CA (US); Dave Huffman, San Jose, CA (US)

(73) Assignee: Sensor Platforms, Inc., Santa Rosa, CA (US)

( * ) Notice: Subject to any disclaimer, the term of this patent is extended or adjusted under 35 U.S.C. 154(b) by 70 days.

(21) Appl. No.: 11/755,584

(22) Filed: May 30, 2007

(51) Int. Cl.
*H03K 3/02* (2006.01)
*H03L 1/00* (2006.01)

(52) U.S. Cl. .................................. 331/143; 331/175
(58) Field of Classification Search .................. 331/111, 331/143, 175
See application file for complete search history.

(56) References Cited

U.S. PATENT DOCUMENTS 3,745,367 A * 7/1973 Schindler et al. ............ 307/108

* cited by examiner

*Primary Examiner*—David Mis
(74) *Attorney, Agent, or Firm*—Fernandez & Associates, LLP (57) ABSTRACT

The invention relates to an electronic circuit comprising a first comparator having a first input offset voltage, wherein the first comparator is operatively coupled to a first sampling capacitor, a second comparator having a second input offset voltage, wherein the second comparator is operatively coupled to a second sampling capacitor, and a control circuit operatively coupled to the first comparator and the second comparator for generating alternate cycles having a first phase and a second phase, wherein a first sampled offset voltage is stored in the first sampling capacitor during the first phase of the alternate cycles, wherein the first sampled offset voltage is subtracted from the first input offset voltage during the second phase of the alternate cycles, wherein a second sampled offset voltage is stored in the second sampling capacitor during the second phase of the alternate cycles, and wherein the second sampled offset voltage is subtracted from the second input offset voltage during the first phase of the alternate cycles.

16 Claims, 10 Drawing Sheets

SYSTEM AND METHOD FOR OSCILLATOR NOISE CANCELLATION

BACKGROUND OF THE INVENTION

1. Field of the Invention

The present invention relates to an electronic circuit. More particularly, the invention relates to techniques for noise cancellation in an electronic circuit.

2. Background of the Related Art

There are many applications that benefit from a stable low jitter oscillator. For example, in an application which uses a high frequency clock to measure the periods of a low frequency asynchronous oscillator, the stability of the high frequency clock directly impacts the final result.

Figure 1:
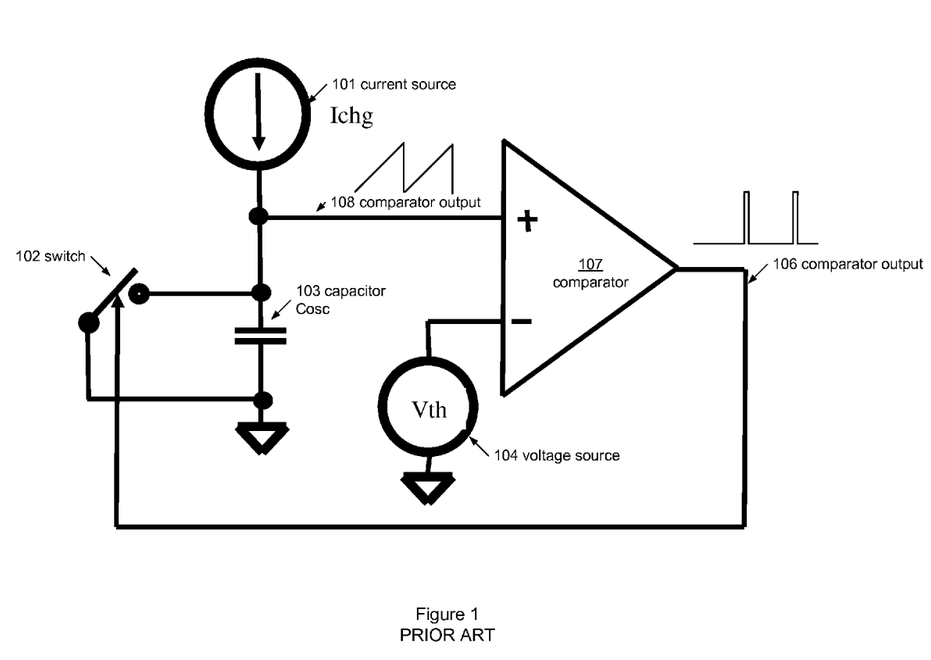
FIG. 1 shows an oscillator circuit.

One means to generate a high frequency oscillator is shown in FIG. 1. This circuit operates by charging a capacitor (103) with a constant current source Ichg (101) into a timing capacitor Cosc (103) (note: assume the comparator output is LOW to start). When the voltage across the capacitor (103) exceeds the threshold voltage Vth (104), the output (106) of the comparator (107) goes high forcing switch (102) to close. Closing switch (102) causes Cosc (103) to discharge causing the comparator output (106) to go LOW. When the comparator output (106) is LOW the capacitor Cosc (103) is once again allowed to charge, and the oscillation repeats. The comparator output (106) produces a string of short pulses while the positive input terminal (108) to the comparator (107) sees a saw tooth waveform.

It should be apparent to one skilled in the art that increasing Vth (104) will decrease the oscillator frequency, as it takes longer to charge Cosc (103), while decreasing Vth (104) will increase the oscillator frequency. Electronic noise in either Vth (104), Ichg (101) or the input referred noise to the comparator (107) will create changes in the frequency (i.e. phase noise) of the oscillator.

For the example described above (i.e. using a high frequency oscillator to count a fixed duration of a lower frequency oscillator), 1/F noise is of particular concern. 1/F noise has the characteristic of increasing in magnitude as the noise is examined at lower frequencies. Thus counting a long duration of the low frequency oscillator increases the need for stabilizing the high frequency oscillator against 1/F noise. The longer the time duration to be counted the worse in frequency is the 1/F noise and the more problematic it is in maintaining the frequency stability of the high frequency oscillator over that long time duration.

1/F noise is also problematic for measuring short durations of the low frequency oscillator in that repeated measurements taken with long intervals between measurements (e.g., seconds or days) will cause non-repeatable results. There are several sources for 1/F noise in the above circuit, for example, comparator input referred noise, Vth source and Ichg current. The examples disclosed here eliminate all of these sources of 1/F noise from contributing to changes in the oscillator frequency.

SUMMARY OF THE INVENTION

In general, in one aspect, the invention relates to an electronic circuit comprising a first comparator having a first input offset voltage, wherein the first comparator is operatively coupled to a first sampling capacitor, a second comparator having a second input offset voltage, wherein the second comparator is operatively coupled to a second sampling capacitor, and a control circuit operatively coupled to the first comparator and the second comparator for generating alternate cycles having a first phase and a second phase, wherein a first sampled offset voltage is stored in the first sampling capacitor during the first phase of the alternate cycles, wherein the first sampled offset voltage is subtracted from the first input offset voltage during the second phase of the alternate cycles, wherein a second sampled offset voltage is stored in the second sampling capacitor during the second phase of the alternate cycles, and wherein the second sampled offset voltage is subtracted from the second input offset voltage during the first phase of the alternate cycles.

In general, in one aspect, the invention relates to an electronic circuit comprising a first comparator and a second comparator, each having a corresponding offset voltage and operatively coupled to a corresponding sampling capacitor, and a control circuit operatively coupled to the first comparator and the second comparator for generating a reset period and a non-reset period of the electronic circuit, wherein a sampled offset voltage associated with at least one selected from a group consisting of the first comparator and the second comparator is stored in the corresponding sampling capacitor during the reset period, wherein the sampled offset voltage is subtracted from the corresponding input offset voltage during the non-reset period.

In general, in one aspect, the invention relates to a method for reducing effects from a noise source of an electronic circuit having a first comparator and a second comparator, each of the first comparator and the second comparator having a corresponding offset voltage and operatively coupled to a corresponding sampling capacitor, the method comprising operating the electronic circuit at an operating frequency substantially higher than a frequency of the noise source, generating a reset period and a non-reset period of the electronic circuit, storing a sampled offset voltage associated with at least one selected from a group consisting of the first comparator and the second comparator in the corresponding sampling capacitor during the reset period, and subtracting the sampled offset voltage subtracted from the corresponding input offset voltage during the non-reset period.

Other aspects and advantages of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. In other instances, well-known features have not been described in detail to avoid obscuring the invention.

The oscillator shown in FIG. 1, as is known within the art, is implemented using a current source (101), a switch (102), a capacitor (103), a voltage source (104), and a comparator (107). The switch may be implemented using a transistor fabricated using various technologies well known in the art, or any other suitable devices. The voltage source may be implemented as a current passing through a resistor, or other suitable circuit configurations. The oscillator shown in FIG. 1 produces short pulses on its output (106) which is often undesirable when used as a clock for logic signals. This could be fixed by running the oscillator at twice the frequency and dividing down the output with a toggle flip flop, however, designing the oscillator to run at twice the desired frequency requires more power and complicates the design of the comparator (e.g., it needs to have a higher bandwidth).

Figure 2:
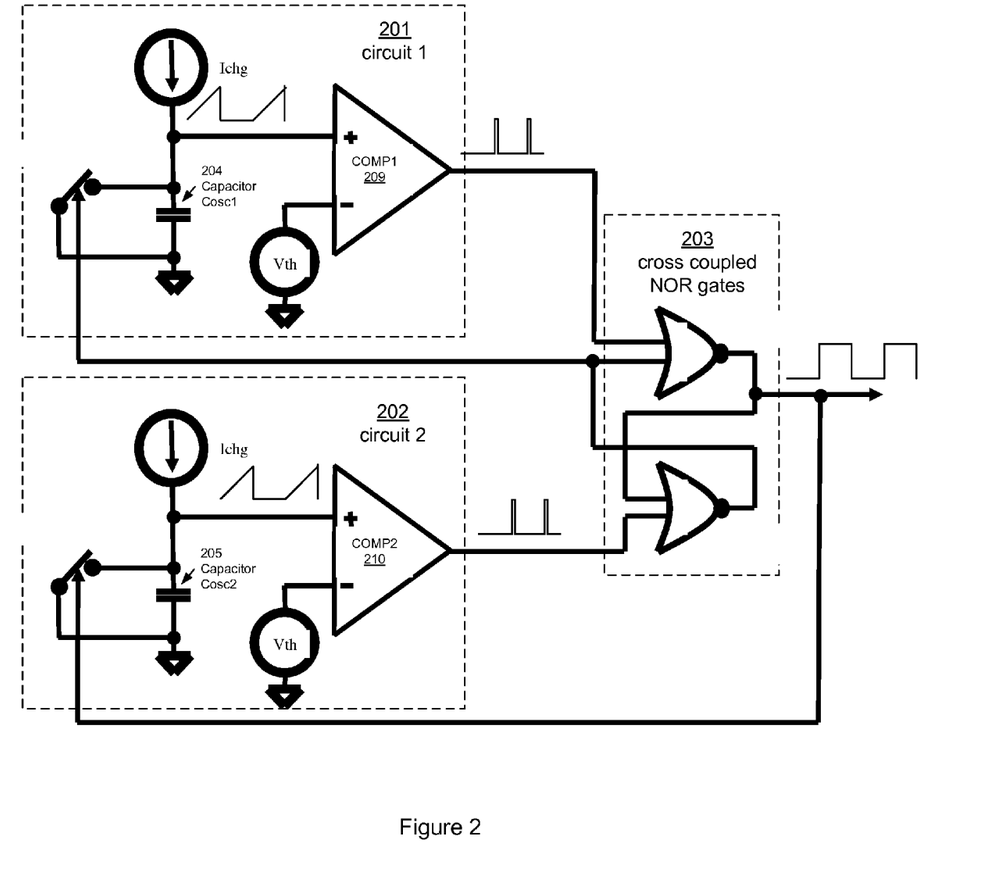
FIG. 2 shows an oscillator circuit which produces 50% output duty cycle.

The oscillator shown in FIG. 2 includes circuit 1 (201), circuit 2 (202), and cross coupled NOR gates (203). The circuit 1 (201) and circuit 2 (202) are both essentially the same as the circuit shown in FIG. 1. Based on the operation of the cross coupled NOR gates (203), the oscillator shown in FIG. 2 produces a 50% duty cycle output with alternative cycles (alternating between a first phase and a second phase) but still suffers from sensitivity to 1/F noise. The advantage of this design, however, is that each comparator of the circuit 1 (201) and circuit 2 (202) runs at the clock frequency (as opposed to twice the clock frequency as would be required by the circuit in FIG. 1) in order to produce a 50% duty cycle. This circuit operates by alternating between charging and discharging the two timing capacitors (204) and (205). When one capacitor is charging the other is discharging.

Figure 3:
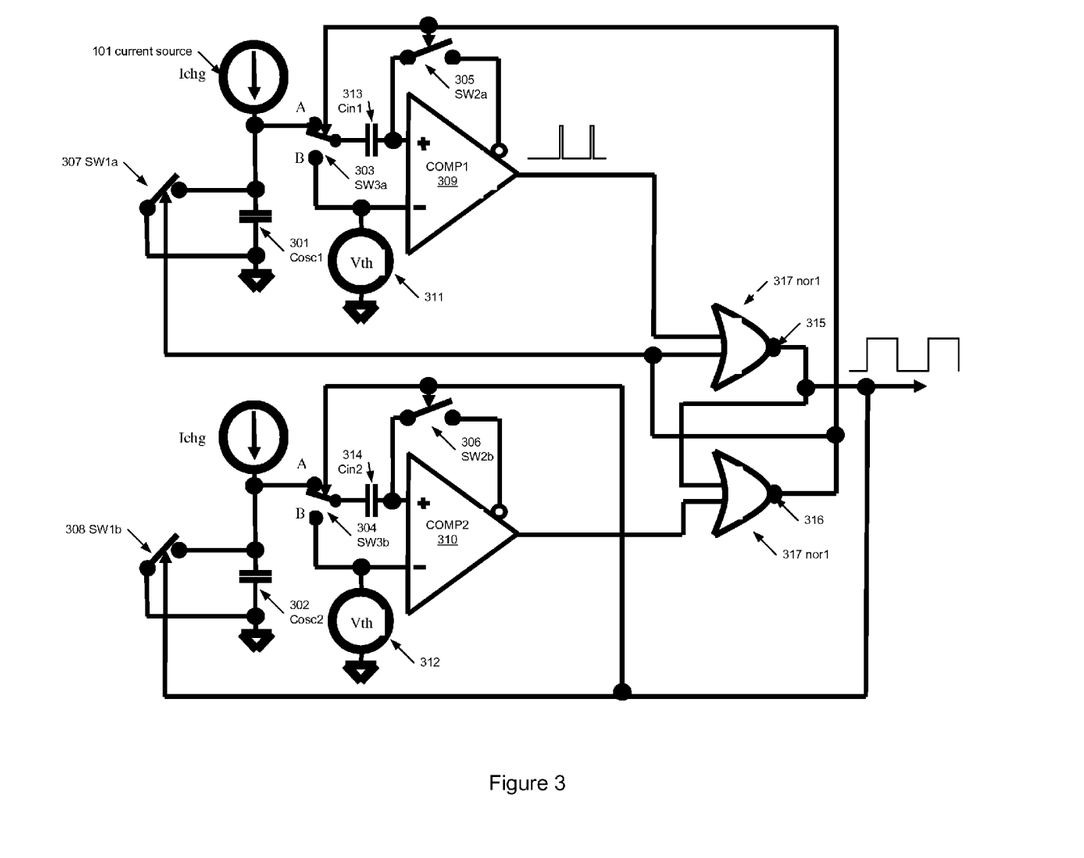
FIG. 3 shows an example of an oscillator with comparator input noise cancellation.

With the addition of minimal extra circuitry, (i.e., SW3a (303), SW3b (304), Cin1 (313), Cin2 (314), SW2A (305), and SW2b (306) shown in FIG. 3) the oscillator shown in FIG. 2 can be modified to eliminate the 1/F noise contribution from the comparators. This circuit in FIG. 3 operates similarly to the circuit in FIG. 2, however, during a reset phase when either of the Cosc1 (301) or Cosc2 (302) capacitors is being discharged, SW2a (305) or SW2b (306) is closed and SW3a (303) or SW3b (304) is in the B position, respectively. Conversely, during a non-reset phase when Cosc1 (301) or Cosc2 (302) is charging, SW2a (305) or SW2b (306) is open and SW3a (303) or SW3b (304) is in the A position, respectively. For example, assume that Cosc1 (301) is being discharged (i.e. SW1a (307) is closed) and that Cosc2 (302) is charging (i.e. SW1b (308) is open). Thus, SW3a (303) is in the B position and SW2a (305) is closed. With SW2a (305) closed, COMP1 (309) acts like an operational amplifier in unity gain feedback wherein the feedback forces the positive input terminal voltage of COMP1 (309) to equal the negative input terminal voltage of COMP1 (309) (i.e. Vth (311)). With noise canceling capacitor Cin1 (313) connected to Vth (311) via SW3a (303) in B position and with the positive input terminal of COMP1 (309) being forced to voltage level of Vth (311), Cin1 (313) is discharged with zero volts across it. As Cosc2 (302) charges, the output of COMP2 (310) will go high and force the output (316) of nor2 (318) to a LOW which in turn causes the output of nor1 (315) to go HIGH. When the output (316) of nor2 (318) goes LOW SW2a (305) opens, SW3a (303) goes to the A position, SW1a (307) opens and Cosc1 (301) starts to charge. When SW3a (303) switches to the A position, Cosc1 (301) has zero volts across it (as it was previously discharged when SW1a (307) was closed), which initially forces the positive input terminal of COMP1 (309) to zero volts. As Cosc1 (301) charges, the voltage at the positive input terminal of COMP1 (309) increases as there is no charge path to charge Cin1 (313) (i.e. the voltage across Cin1 (313) stays at zero volts as the input impedance looking into the positive input terminal of the comparator COMP1 (309) is very high). Ultimately, Cosc1 (301) charges up to the same voltage level as Vth (311) and the output of COMP1 (309) goes high forcing the output (315) of nor1 (317) to a LOW and the cycle repeats. One skilled in the art will appreciate that the reset phase for a first portion of the oscillator, associated with COMP1 (309), is the non-reset phase for a second portion of the oscillator, associated with COMP2 (310), and vice versa.

Figure 4:
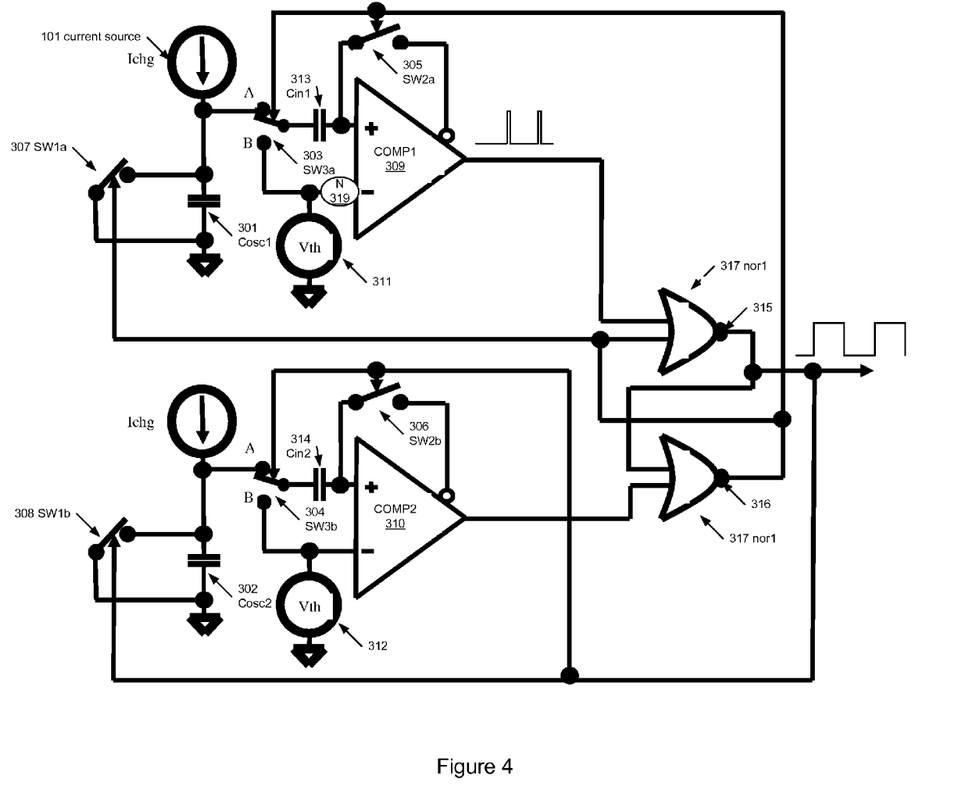
FIG. 4 is used to explain how the comparator input noise is cancelled

The circuit shown in FIG. 4 is the same as shown in FIG. 3 but with the addition of a 1/F noise source (319) (shown as voltage source N) at the negative input terminal of COMP1 (309). This noise source models the effect of 1/F input referred noise of COMP1 (309) and is not actually present in the circuit. The noise source is modeled as a voltage source in series with Vth (311) and acts to change the threshold voltage of COMP1 (309). If this noise source appeared in the circuit shown in FIG. 2, it would alter the oscillators frequency as Cosc1 (204) would charge to the new "equivalent" threshold of COMP1 (209) (i.e. Vth+N). However, the topology of the circuit shown in FIGS. 3 and 4 act to cancel the effect of the noise source, resulting in an oscillator frequency that does not depend on the magnitude of the noise source (319). In the reset phase of the circuit when SW2a (305) is closed and SW3a (303) is connected to Vth (311) using position B, the positive input terminal of COMP1 (309) is forced equal to the negative input terminal of COMP1 (309) by the negative feedback through SW2a (305) in closed position. The voltage at negative input terminal of COMP1 (309) is Vth+N. Consequently the voltage across Cin1 (313) is (Vth+N)−Vth=N. Subsequent to charging Cin1 (313) to N during the reset phase, when SW2a (305) opens in the non-reset phase of the circuit, this voltage across Cin1 (313) will cancel out the offset voltage N added by noise source (319) at the negative input terminal of COMP1 (309). For example, assume N=0.1V. Then Cin1 (313) is charged to 0.1V resulting in the trip point of COMP1 (309) being restored to Vth (as opposed to Vth+N). This happens because when Cosc1 (313) reaches Vth, the positive input terminal of COMP1 (309) sees Vth+N (note: the extra voltage N being supplied by the voltage across Cin1 (313)). Since the negative input terminal of COMP1 (309) also sees Vth+N, the output of COMP1 (309) trips. Thus, the trip point of COMP1 (309) (hence the oscillator frequency) is no longer sensitive to the voltage N of the noise source (319) and is fixed at Vth.

One skilled in the art will appreciate that the noise canceling operation of the circuit shown in FIG. 4 is based on the 1/F noise voltage plus comparator offset being stored on Cin1 (313) and Cin2 (314) which is shown to be connected to the positive input terminals of the comparators COMP1 (309) and COMP2 (310).

Figure 5:
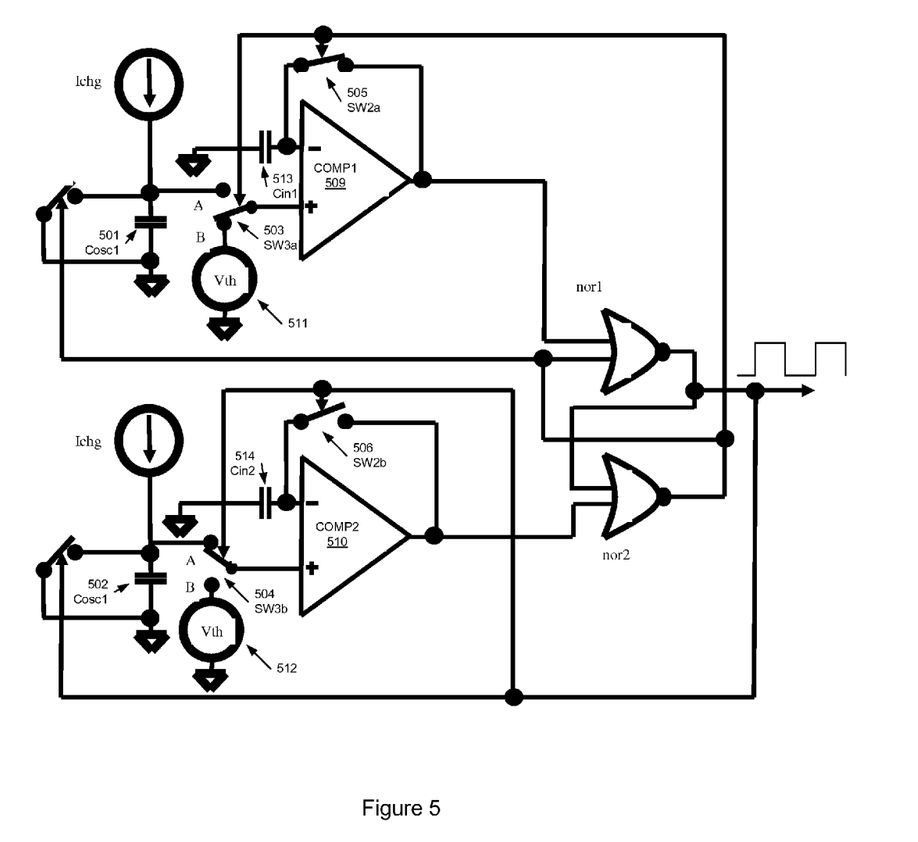
FIG. 5 shows an alternative implementation of the comparator input noise cancellation scheme illustrated in FIG. 3 and FIG. 4.

FIG. 5 shows a similar 1/F noise and offset correction with Cin1 (513) and Cin2 (514) connected to the negative input terminal of the comparators COMP1 (509) and (510). In this configuration, SW3a (503) or SW3b (504) is connected to Vth (511) or Vth (512) whenever SW2a (505) or SW2b (506) is closed, respectively. In this condition, the comparators COMP1 (509) and COMP2 (510) work as high gain amplifiers with negative feedback forcing the negative input terminal voltages to equal the Vth voltage applied to the positive input terminals (note: the voltage on the negative terminal will equal the Vth voltage plus the 1/F noise component plus the comparator offset).

Note that the output of the comparators COMP1 (509) and COMP2 (510) are directly fed back to the negative input terminals (as opposed to the inverted comparator output feeding back to the positive input terminal shown in FIGS. 3 and 4). While this configuration can be made to work, it poses a few more circuit challenges as the non-inverting output of the comparator requires a minimum of two gain stages (note: each gain stage adds a signal inversion). Doing analog feedback around two gain stages introduces a second pole into the feedback system and complicates stabilizing the feedback loop. One advantage of the configuration shown in FIG. 5 is that the charging signals across Cosc1 (501) or Cosc2 (502) no longer appears in series with Cin1 (513) or Cin2 (514), respectively. Thus stray capacitance at the comparator input sides of Cin1 (513) or Cin2 (514) won't divide the input signals resulting in comparator trip points closer to Vth voltage level.

Figure 6A:
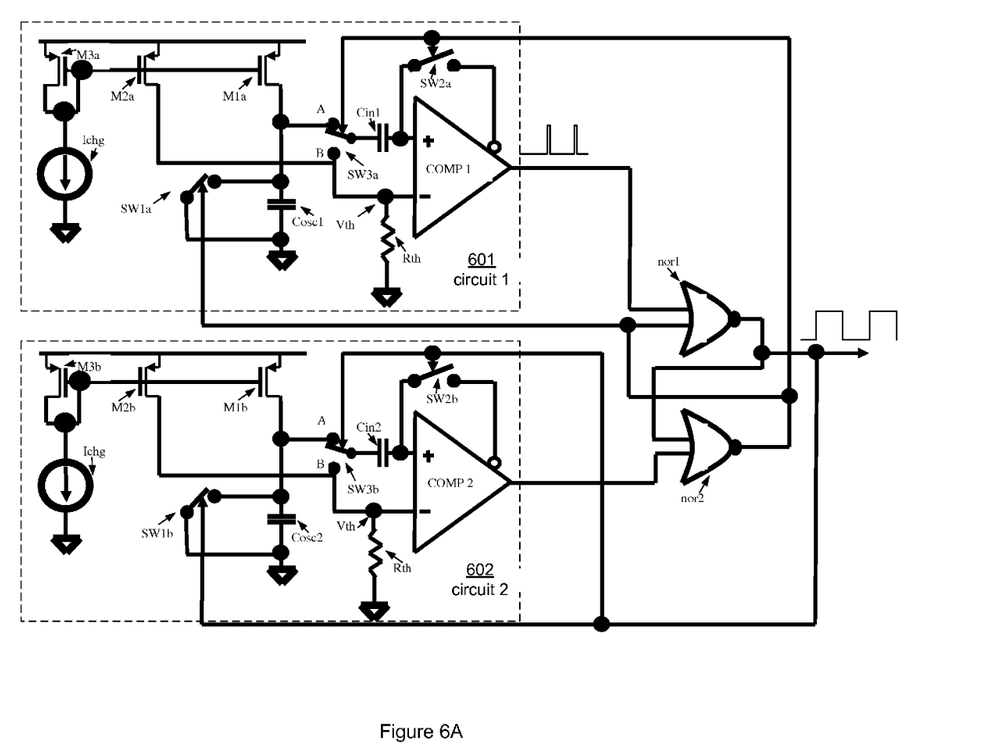
FIGS. 6A, 6B, and 6C show a further improvement on noise cancellation by greatly reducing the noise contributed by the timing capacitor charging current

The circuit shown in FIG. 6A includes circuit 1 (601) and circuit 2 (602) each having essentially the same components denoted by the same names. The components in circuit 1 (601) are denoted with names ending in "a" or "1", while the components in circuit 2 (602) are denoted with the same names ending in "b" or "2". The description below refers to each component in both circuit 1 (601) and circuit 2 (602) together using the name without the ending "a", "1", "b", or "2". The circuit shown in FIG. 6 not only eliminates the 1/F input referred noise of the comparators but also eliminates most of the 1/F noise components from Vth and Ichg. In order to understand how the circuit topology shown in FIG. 6 acts to eliminate the Ichg and Vth 1/F noise components, it is best to write the equations that determine the frequency of the oscillator. The frequency of the oscillator shown in FIG. 6 is given by the following set of equations:

$Cosc$ charge time=$(Cosc/Ichg)*Vth$=amount of time it takes to charge either $Cosc1$ or $Cosc2$ from zero volts to $Vth$.

$Vth=Ichg*Rth$=voltage at the negative input terminal to either $COMP1$ or $COMP2$ (assuming $M1$ and $M2$ mirror the current in $M3$ one to one)

Combining the above two equations, it can be shown:

$Cosc$ charge time=$(Cosc/Ichg)*(Ichg*Rth)=Cosc*Rth$

The oscillator frequency is then given by: Fosc=1/(2*Cosc*Rth) (note: the factor of two accounts for the fact that two capacitors charge per cycle)

Thus the charge time of Cosc (and hence the oscillator frequency) only depends on Cosc and Rth and not on Ichg. Intuitively this makes sense as follows: if Ichg is increased then the charging rate of Cosc is increased (i.e. it charges faster), however, the comparator trip point is increased proportionately which means Cosc must charge to a higher voltage to trip the comparator (thus taking more time). However, the increased charge rate of Cosc is exactly counterbalanced by the increased threshold of the comparator. Neither Cosc nor Rth contribute 1/F noise as they are passive components. Thus since the oscillator frequency is only determined by Cosc and Rth, the 1/F noise component from Ichg and Vth has been eliminated.

Since Cosc and Rth are driven by separate current sources (M1 and M2), it is possible for 1/F noise to exist in each current source. Preferably, M1 and M2 are large devices with long channel lengths and thereby greatly reduce the amount of 1/F noise they contribute (also, it is well known within the art that p-channel devices have less 1/F noise than n-channel devices, therefore the current sources M1 and M2 may be advantageously implemented in p-channel devices). As shown above the 1/F noise present in the Ichg current source (which might come from a bandgap based circuit) does not affect the oscillator frequency as the oscillator frequency does not depend on Ichg.

The circuit as shown in FIG. 6A can be simplified somewhat by combining the M2 current sources into driving one common Rth resistor which provides the reference voltage to both comparators. Similarly the M3 transistors can be combined into one.

Figure 6B:
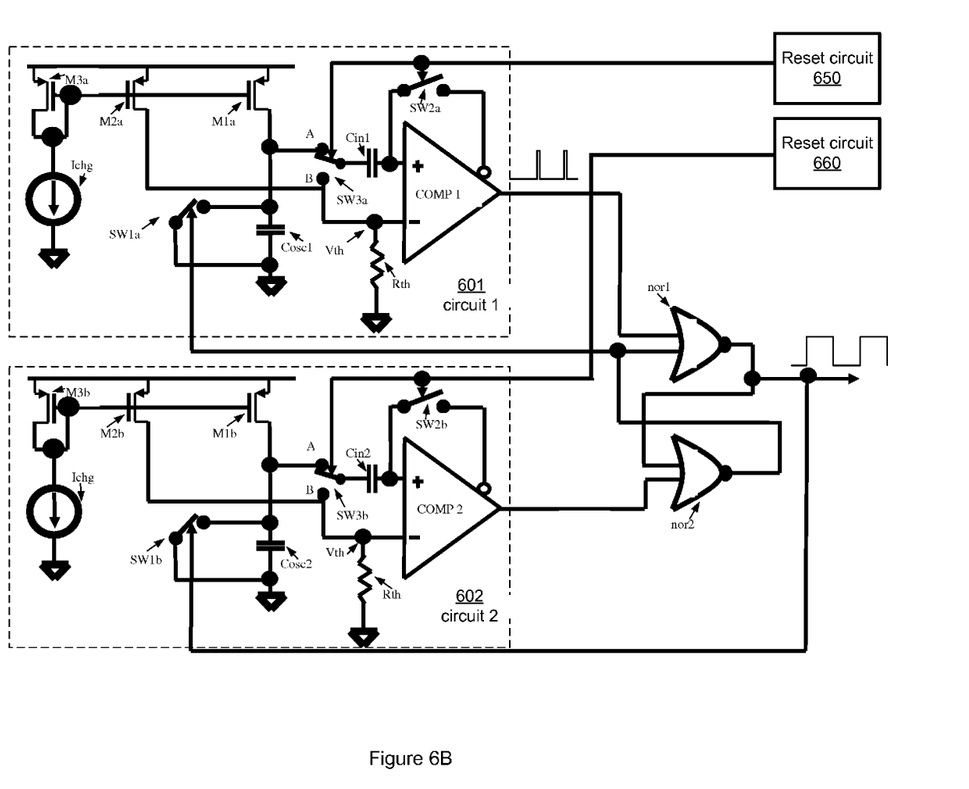
Figure 6C:
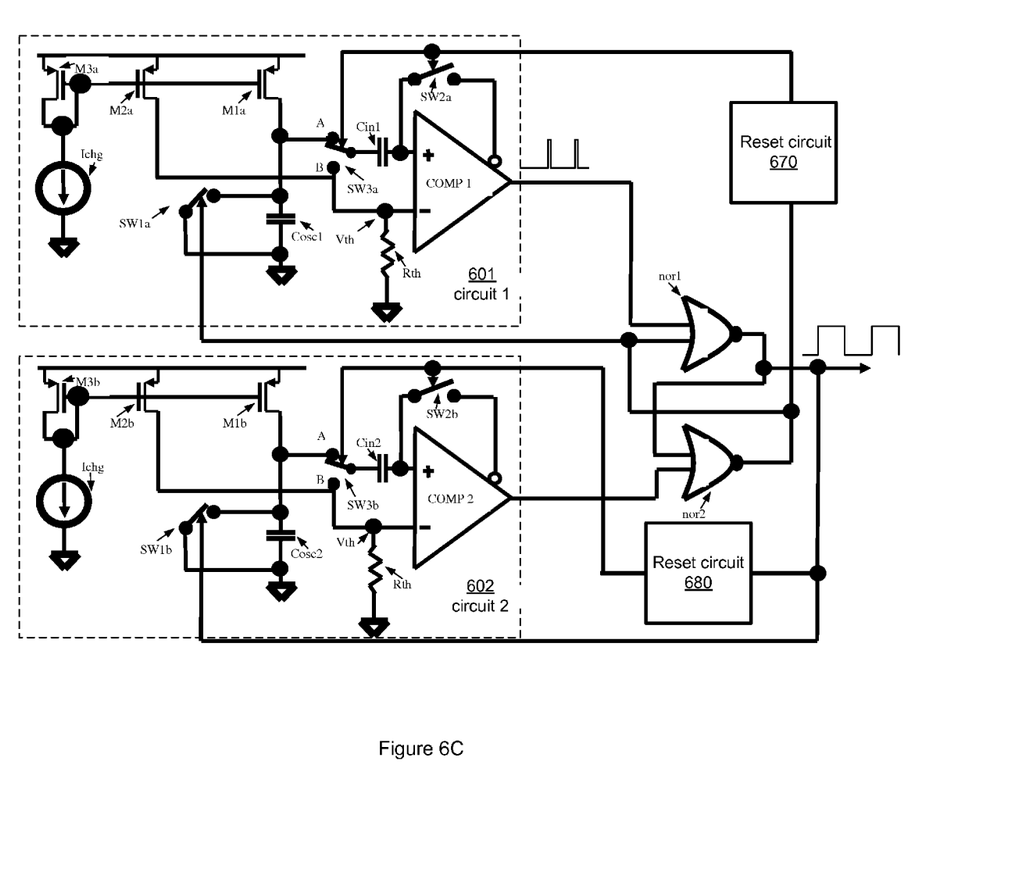

One exemplary application of the circuit shown in FIG. 6A is for measuring a period of a low frequency signal using the output of the circuit. In some examples, the circuit shown in FIG. 6A may be configured differently if the measurement cycle is shorter than the period of a corner frequency of the 1/F noise. FIGS. 6B and 6C shows examples of these varied configurations having reset circuits to generate reset periods for charging the noise canceling capacitors Cin1 and Cin2. In FIG. 6B, the reset circuits (650) and (660) generate a reset period in response to a manual reset input or other signals manually or automatically activated. In FIG. 6C, the reset circuits (670) and (680) generate reset periods based on the oscillator outputs of the circuit. In one example, the circuit shown in FIG. 6A is a special case of the circuit shown in FIG. 6C where the reset circuits (670) and (680) are straight pass-through connections. In another example, the reset circuits (670) and (680) may be divider circuits that divide the oscillator outputs into lower frequency cycle periods synchronized with the oscillator outputs.

Figure 7:
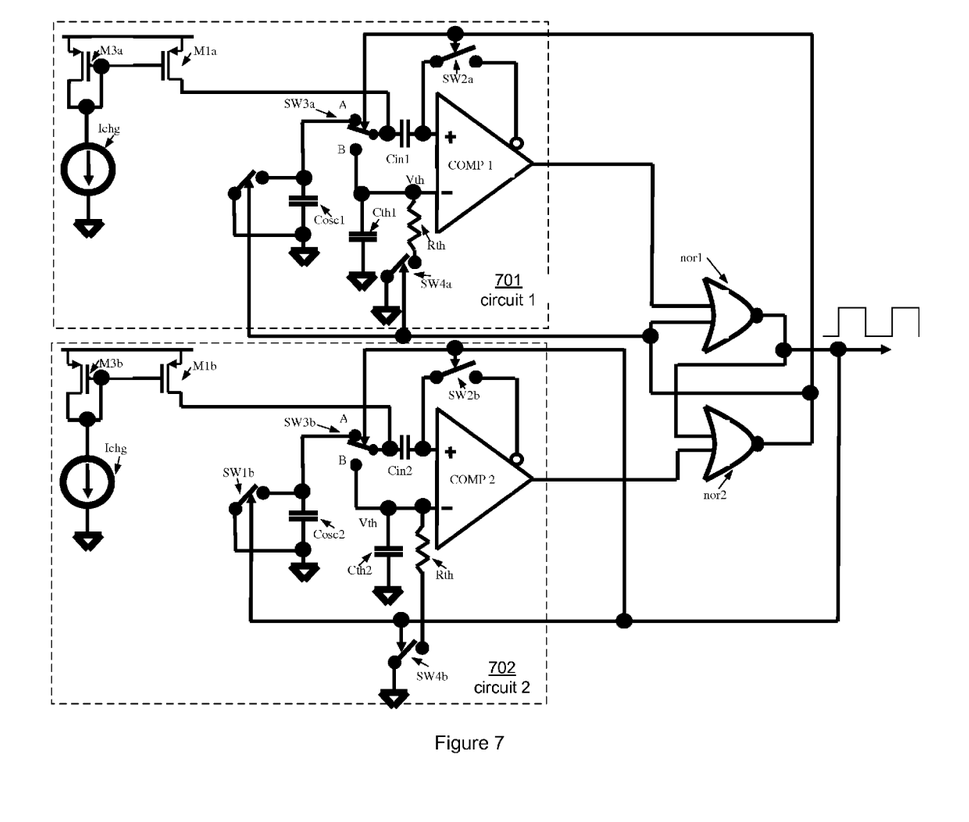
FIG. 7 shows a further improvement on the noise cancellation scheme illustrated in FIGS. 6A, 6B, and 6C wherein the noise contribution from the timing capacitor charging current is completely eliminated

The circuit shown in FIG. 7 includes circuit 1 (701) and circuit 2 (702) with essentially the same components denoted by the same names. The components in circuit 1 (701) are denoted with names ending in "a" or "1", while the components in circuit 2 (702) are denoted with the same names ending in "b" or "2". The description below refers to each component in both circuit 1 (701) and circuit 2 (702) together using the name without the ending "a", "1", "b", or "2".

The circuit, shown in FIG. 7, operates by switching a single current supplied by M1 between charging Cosc and charging Cth (the noise cancellation capacitor). During a reset phase of the circuit when M1 is switched to Cth and Rth (i.e. SW3 is in the B position), SW4 is closed and the voltage Vth is given by $I_{M1}*Rth$. During a non-reset phase of the circuit when M1 is switched to charge Cosc (i.e. SW3 is in the A position), SW4 is open and Vth is retained across Cth (note: if SW4 were not present, Cth would tend to discharge through Rth when M1 was not connected to it). Any 1/F noise in $I_{M1}$ is thus applied equally to both Vth and Cosc resulting in a cancellation of the 1/F noise, as described previously (i.e. the oscillator frequency does not depend on the value of $I_{M1}$). This technique, and the other switching techniques described in this disclosure, work as long as the oscillator frequency is much larger than the frequency of the 1/F noise. For an example for which this circuit was designed, the oscillator frequency is 20 Mhz which is a much higher frequency than most 1/F noise components (1/F noise is typically considered negligible above 1 Mhz).

Figure 8:
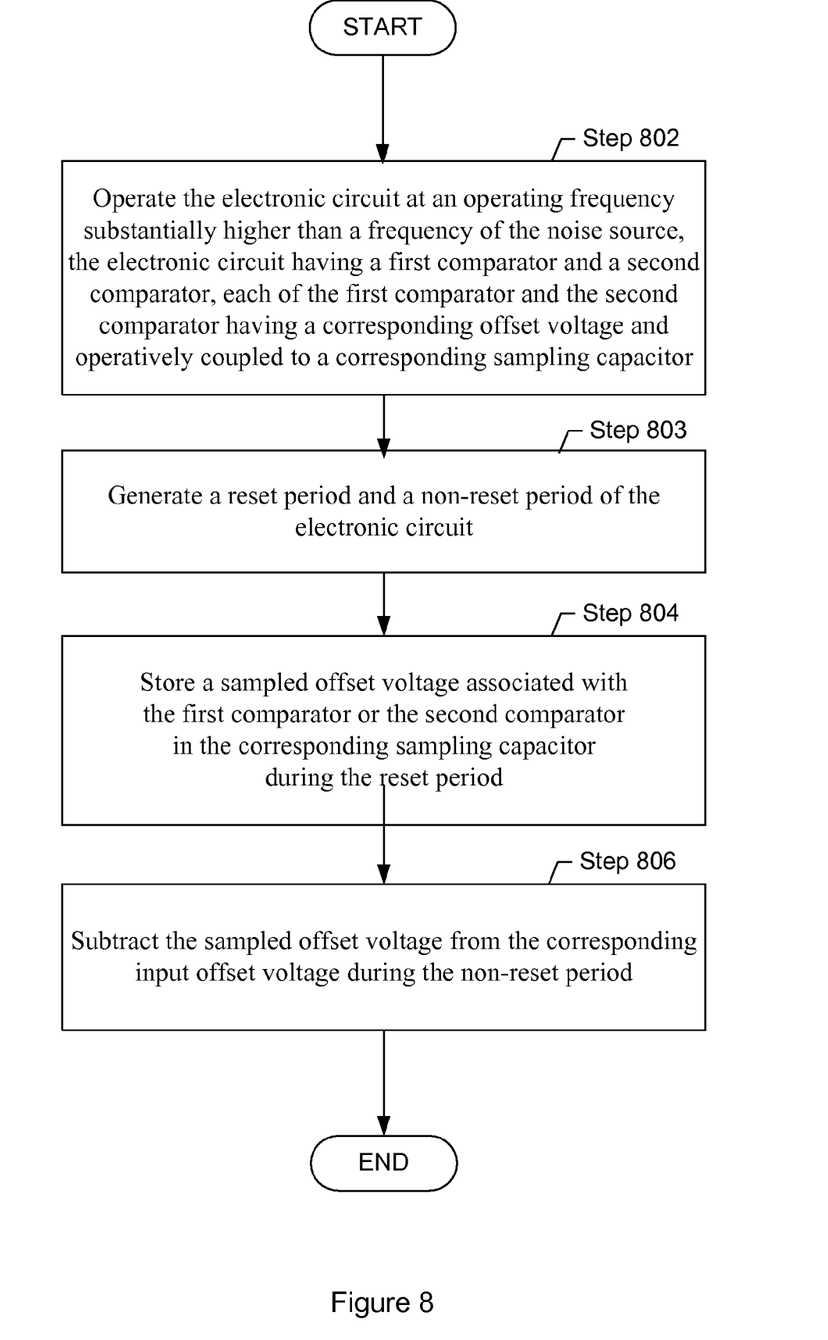
FIG. 8 shows a flow chart of a noise cancellation method.

FIG. 8 shows a flow chart of a noise cancellation method. The method may be implemented, for example, using any one of the circuits shown in FIGS. 3, 4, 5, 6A, 6B, 6C, and 7. The electronic circuit is operated at an operating frequency substantially higher than a frequency of the noise source (Step 802). A reset period and a non-reset period of the electronic circuit are generated, wherein the reset period is generated based on a manual reset input (based e.g., on the circuit shown in FIG. 6B), a first phase associated with the operating frequency (based e.g., on any of the circuits shown in FIGS. 3, 4, 5, 6A, and 7), or dividing down the operating frequency (based e.g., on the circuit shown in FIG. 6C) (Step 803). During the reset period, a charge is accumulated on a noise canceling capacitor(s) and the charge includes a contribution from the noise source (Step 804). During the non-reset period, at least a portion of the effect from the noise source is cancelled based on the charge accumulated on the noise canceling capacitor(s) (Step 806).

Although the examples given above describe oscillator circuits, one skilled in the art will appreciate that the noise cancellation technique can be applied to other circuit function employing the noise cancellation capacitor configured for operation in similar fashion. It will be understood from the foregoing description that various modifications and changes may be made in the preferred and alternative embodiments of the present invention without departing from its true spirit. For example, the switches, such as SW1, SW2, or SW3, may be implemented using MOS transistors, bipolar transistors, or other suitable switching devices, the circuit may include a subset or superset of the elements described in the examples above, the method may be performed in a different sequence, the components provided may be integrated or separate, the devices included herein may be manually and/or automatically activated to perform the desired operation.

This description is intended for purposes of illustration only and should not be construed in a limiting sense. The scope of this invention should be determined only by the language of the claims that follow. The term "comprising" within the claims is intended to mean "including at least" such that the recited listing of elements in a claim are an open group. "A," "an" and other singular terms are intended to include the plural forms thereof unless specifically excluded.

What is claimed is:

1. An electronic circuit, comprising:
   a first comparator having a first input offset voltage, wherein the first comparator is operatively coupled to a first sampling capacitor;
   a second comparator having a second input offset voltage, wherein the second comparator is operatively coupled to a second sampling capacitor; and
   a control circuit operatively coupled to the first comparator and the second comparator for generating alternate cycles having a first phase and a second phase,
   wherein a first sampled offset voltage is stored in the first sampling capacitor during the first phase of the alternate cycles,
   wherein the first sampled offset voltage is subtracted from the first input offset voltage during the second phase of the alternate cycles,
   wherein a second sampled offset voltage is stored in the second sampling capacitor during the second phase of the alternate cycles, and
   wherein the second sampled offset voltage is subtracted from the second input offset voltage during the first phase of the alternate cycles.

2. The electronic circuit of claim 1,
   wherein the electronic circuit comprises an oscillator having an oscillator output comprising the alternate cycles,
   wherein the first comparator is reset during the first phase of the alternate cycles, and
   wherein the second comparator is reset during the second phase of the alternate cycles.

3. The electronic circuit of claim 2,
   wherein the control circuit comprises a timing capacitor, a current to voltage translation circuit, and a current source transistor for determining a period of at least one phase selected from a group consisting of the first phase and the second phase of the alternate cycles,
   wherein the control circuit is configured to generate a first current and a second current,
   wherein the period of the at least one phase is determined by a charging time of the first current charging the timing capacitor to exceed a threshold during the at least one phase,
   wherein the threshold is determined based on the second current and the current to voltage translation circuit during an opposite phase of the at least one phase,
   wherein the second current is generated from the current source transistor, and
   wherein a size of the current source transistor is determined to reduce a 1/F output noise of the current source transistor.

4. The electronic circuit of claim 3,
   wherein the current to voltage translation circuit comprises a resistor.

5. The electronic circuit of claim 2,
   wherein the control circuit comprises a timing capacitor and a current to voltage translation circuit for determining a period of at least one phase selected from a group consisting of the first phase and the second phase of the alternate cycles,
   wherein the control circuit is configured to generate a first current and a second current,
   wherein the period of the at least one phase is determined by a charging time of the first current charging the timing capacitor to exceed a threshold during the at least one phase,
   wherein the threshold is determined based on the second current and the current to voltage translation circuit during an opposite phase of the at least one phase,
   wherein the threshold is stored in at least one sampling capacitor selected from a group consisting of the first sampling capacitor and the second sampling capacitor concurrently with storing a corresponding sampled offset voltage associated with the at least one sampling capacitor during the opposite phase of the at least one phase.

6. The electronic circuit of claim 5,
   wherein the current to voltage translation circuit comprises a resistor.

7. The electronic circuit of claim 5,
   wherein the first current and the second current is generated from a same current source, and
   wherein 1/F noise effects from the same current source is cancelled by matching a noise induced threshold variation and a noise induced charging time variation.

8. An electronic circuit, comprising:
   a first comparator and a second comparator, each having a corresponding offset voltage and operatively coupled to a corresponding sampling capacitor; and
   a control circuit operatively coupled to the first comparator and the second comparator for generating a reset period and a non-reset period of the electronic circuit,
   wherein a sampled offset voltage associated with at least one selected from a group consisting of the first comparator and the second comparator is stored in the corresponding sampling capacitor during the reset period,
   wherein the sampled offset voltage is subtracted from the corresponding input offset voltage during the non-reset period.

9. The electronic circuit of claim 8,
wherein the control circuit comprises a manual reset circuit for generating the reset period responsive to a manual reset input.

10. The electronic circuit of claim 8,
wherein the electronic circuit comprises an oscillator circuit comprising the first comparator and the second comparator;
wherein the control circuit generates the reset period responsive to an oscillator output of the oscillator circuit.

11. The electronic circuit of claim 10,
wherein the oscillator output comprises alternate cycles having a first phase and a second phase; and
wherein the reset period comprises the first phase of the oscillator output.

12. The electronic circuit of claim 10,
wherein the control circuit generates the reset period by dividing down the oscillator output.

13. A method for reducing effects from a noise source of an electronic circuit having a first comparator and a second comparator, each of the first comparator and the second comparator having a corresponding offset voltage and operatively coupled to a corresponding sampling capacitor, the method comprising:
operating the electronic circuit at an operating frequency substantially higher than a frequency of the noise source;
generating a reset period and a non-reset period of the electronic circuit;
storing a sampled offset voltage associated with at least one selected from a group consisting of the first comparator and the second comparator in the corresponding sampling capacitor during the reset period; and
subtracting the sampled offset voltage from the corresponding input offset voltage during the non-reset period.

14. The method of claim 13,
wherein the reset period is generated based on a manual reset input.

15. The method of claim 13,
wherein a period associated with the operating frequency comprises alternate cycles having a first phase and a second phase; and
wherein the reset period comprises the first phase of the period.

16. The method of claim 13,
wherein a period associated with the operating frequency comprises alternate cycles having a first phase and a second phase; and
wherein the reset period is generated by dividing down the operating frequency.

* * * * *